(12) United States Patent
Villanueva et al.

(10) Patent No.: US 6,970,354 B2
(45) Date of Patent: Nov. 29, 2005

(54) PROCESSOR RETENTION SYSTEM AND METHOD

(75) Inventors: George Villanueva, Hutto, TX (US); Daniel S. Carr, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 152 days.

(21) Appl. No.: 10/637,470

(22) Filed: Aug. 8, 2003

(65) Prior Publication Data

US 2005/0030718 A1   Feb. 10, 2005

(51) Int. Cl.[7] ............................................... G06F 1/20
(52) U.S. Cl. ..................... 361/687; 361/737; 165/80.4; 174/15.2
(58) Field of Search ............................... 361/679–687, 361/724–727, 704, 700, 719–720, 737–742, 361/758–789; 165/80.2–80.4; 439/377; 174/15.1, 174/15.2, 16.1, 16.3

(56) References Cited

U.S. PATENT DOCUMENTS

| | | | |
|---|---|---|---|
| 6,089,900 A | 7/2000 | Ma | 439/377 |
| 6,210,203 B1 | 4/2001 | Ma | 439/377 |
| 6,216,471 B1 | 4/2001 | Patrick et al. | 62/71 |
| 6,501,657 B1 * | 12/2002 | Carr | 361/704 |
| 6,519,149 B1 * | 2/2003 | Inoue | 361/689 |
| 6,527,577 B1 | 3/2003 | Chen et al. | 439/342 |
| 6,579,062 B2 | 6/2003 | Lu et al. | 415/213.1 |
| 2004/0228095 A1 * | 11/2004 | Lee et al. | 361/704 |

* cited by examiner

*Primary Examiner*—Hung Van Duong
(74) *Attorney, Agent, or Firm*—Hamilton & Terrile, LLP; Robert W. Holland

(57) ABSTRACT

A processor retainer assembly prevents inadvertent removal of a processor from a circuit board socket by forces exerted on an information handling system that are translated from a heat sink to the processor by the coupling of thermal grease between the heat sink and the processor. A retention frame couples to a motherboard around the processor socket to support movement of the processor retainer between open and closed positions. A securing device hinge rotationally couples the processor retainer to the retention frame and a securing device latch locks the processor retainer in the closed position to restrict movement of the processor from the socket. A heat sink contacts the processor through an opening in the processor retainer. Heat sink supports extending from the retention frame engage the heat sink so that a single processor retainer assembly retains the processor in the socket and the heat sink proximate to the processor.

17 Claims, 4 Drawing Sheets

PROCESSOR RETENTION SYSTEM AND METHOD

BACKGROUND OF THE INVENTION

1. Field of the Invention

The present invention relates in general to the field of information handling system processor retention, and more particularly to a system and method for retaining a central processing unit in a motherboard socket.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems have steadily increased the speed at which information is processed as processing components have improved in their processing capabilities. In particular, central processing units (CPUs) have steadily improved the speed at which information is processed by packing greater numbers of transistors more closely together and by operating at increased clock speeds. Although more powerful processors improve information processing speeds, the greater number of circuits and faster clock speeds tend to generate greater amounts of heat. Typically, excess heat generated by a CPU is removed by a heat sink placed over top of the CPU on the motherboard of the information handling system. Generally, as the amount of heat produced by CPUs increases, the size of the heat sink is increased to more effectively absorb and dissipate the additional heat. In addition, thermal grease is typically placed between the CPU and heat sink to aid in the conduction of heat from the CPU to the heat sink.

One difficulty with the use of more massive heat sinks to dissipate CPU heat is that the greater the mass of a heat sink the more difficult it is to retain the heat sink in place over the CPU. If the heat sink moves due to forces applied to an information handling system, the forces are translated to the CPU by the coupling force of the thermal grease between the heat sink and the CPU. For instance, a parting force of 25 pounds or more is often created between a heat sink and CPU when a thermal grease interface is applied. By comparison, CPU retention force associated with CPU pin insertion into socket pin holes is typically around 14 pounds. Thus, an upward force applied to a massive heat sink can generate sufficient force to remove the CPU from its socket. Movement of a CPU in a socket by translation of force from a heat sink often results in failure of information handling system operations as signals are lost and CPU pin damage if the force of the heat sink presses misaligned CPU pins into the socket. One solution is to use thermal tape having a lower bond strength instead of thermal grease as an interface between the heat sink and CPU, however, thermal tape is expensive and less effective at conducting heat. Another solution is add to the retention of the heat sink to reduce heat sink movement, however, reinforcing the heat sink usually uses additional parts that increase the complexity of information handling system assembly and increase the risk of loose parts causing damage to the information handling system.

SUMMARY OF THE INVENTION

Therefore a need has arisen for a method and system which retains a processor in a circuit board socket to counteract forces applied by the heat sink to the processor.

A further need exists for a method and system which separately retains a processor in its socket and a heat sink over the processor with a single assembly.

In accordance with the present invention, a method and system are provided which substantially reduce the disadvantages and problems associated with previous methods and systems for retaining an information handling system processor and heat sink in place. A processor retainer assembly provides retention force to the processor independent from retention force applied to the heat sink so that forces applied to the heat sink are counteracted to reduce the risk of inadvertent processor removal or damage.

More specifically, a retention frame couples to an information handling system motherboard proximate to the motherboard's CPU socket. A processor retainer couples to the retention frame with a securing device to move between an open position and a closed position. In the open position, the CPU and socket are accessible, such as for assembly or service of the information handling system. In the closed position, the processor retainer engages the CPU to apply a retaining force that maintains the CPU within the processor socket. An opening in the processor retainer allows a heat sink to contact the CPU for heat dissipation. The heat sink couples to the retention frame so that a single retention assembly applies independent retention forces to both the CPU and the heat sink. The retention force applied by the processor retainer to the CPU counteracts removal forces translated from the heat sink to the CPU by the coupling of thermal grease between the CPU and heat sink.

The present invention provides a number of important technical advantages. One example of an important technical advantage is that a processor is positively retained in a circuit board independent from the heat sink to counteract forces applied to the processor by the heat sink through the coupling of thermal grease. Separate processor retention prevents processor movement induced by heat sink movement translated to the processor through thermal grease. For instance, the processor retainer assembly prevents movement of a CPU in a motherboard socket by applying a retaining force to the CPU that is greater than the parting force of the thermal grease. Reduced heat sink-induced CPU movement reduces the risk of information handling system failure due to poor CPU to socket connections and also reduces the risk of CPU pin damage from re-insertion of misaligned CPU pins after a heat sink-induced CPU removal from a socket.

Another example of an important technical advantage of the present invention is that processor and heat sink retention are provided by a single assembly to avoid the use of an increased number of parts in assembly of an information handling system. Incorporation of heat sink and CPU retention in a single retention assembly reduces the complexity and cost of information handling system assembly when compared with assembly of multiple parts. For instance, the risk of damage to motherboard wire lines and processing components installed on a motherboard by loose parts is reduced with the coupling of a single assembly to the motherboard. Further, the retention assembly's independent CPU retention has minimal impact on serviceability with the processor retainer rotationally hinged to the retention frame and released by flexing of the latches.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A processor retainer assembly maintains engagement of a CPU in a motherboard socket against external forces applied to an information handling system that are translated to the CPU by the coupling of thermal grease between the CPU and its heat sink. The processor retainer maintains engagement and prevents accidental disengagement of the CPU from the socket due to shocks/vibrations or other forces acting on CPU disengagement. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
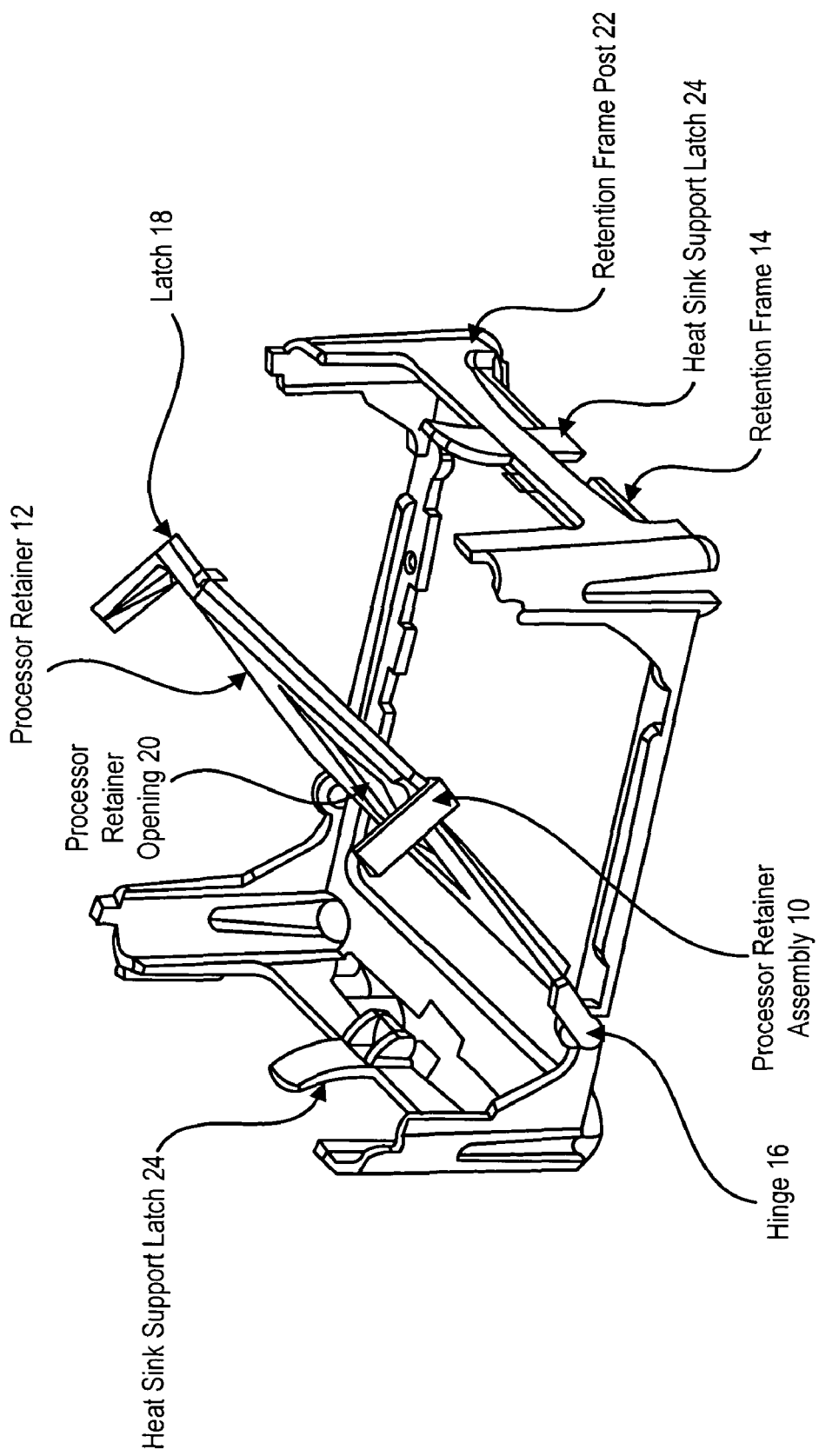
FIG. 1 depicts a side perspective view of a processor retainer assembly.

Referring now to FIG. 1, a side perspective view depicts a processor retainer assembly 10 that retains a processor in a circuit board socket if the processor experiences a removing force, such as a force translated from a heat sink through the coupling of thermal grease between the heat sink and the processor. Processor retainer assembly 10 installs on a circuit board as a single assembled piece with a processor retainer 12 rotationally coupled to a retention frame 14 by a hinge 16 and latch 18 securing device for selective rotation between an open position and a closed position. In the open position, processor retainer 12 rotates to a position substantially perpendicular to retention frame 14 to permit access to a processor and socket installed on an underlying circuit board within the perimeter of retention frame 14. Processor retainer 12 rotates about hinge 16 to a position substantially parallel to retention frame 14 with latch 18 engaging retention frame 14 to secure processor retainer 12 in the closed position. Processor retainer 12 has an opening 20 with a diameter sized to engage the outer diameter of a processor and apply a retaining force against removal of the processor from its circuit board socket.

Retention frame 14 couples to a circuit board with screws or other attachment devices guided by retention frame posts 22 distributed at the corners of retention frame 14. In addition, retention frame posts 22 guide insertion of a heat sink within retention frame 14 and over the upper surface of processor retainer 12. The heat sink contacts the processor through processor retainer opening 20 to conduct heat from the processor, with the conduction of heat encouraged by thermal grease disposed between the heat sink and processor. Heat sink support latches 24 engage notches on the heat sink to hold the heat sink in place over processor retainer opening 20. In this manner, processor retainer assembly 10 installs on a circuit board as a unit to both retain a processor in a socket and retain a heat sink over the processor.

Figure 2:
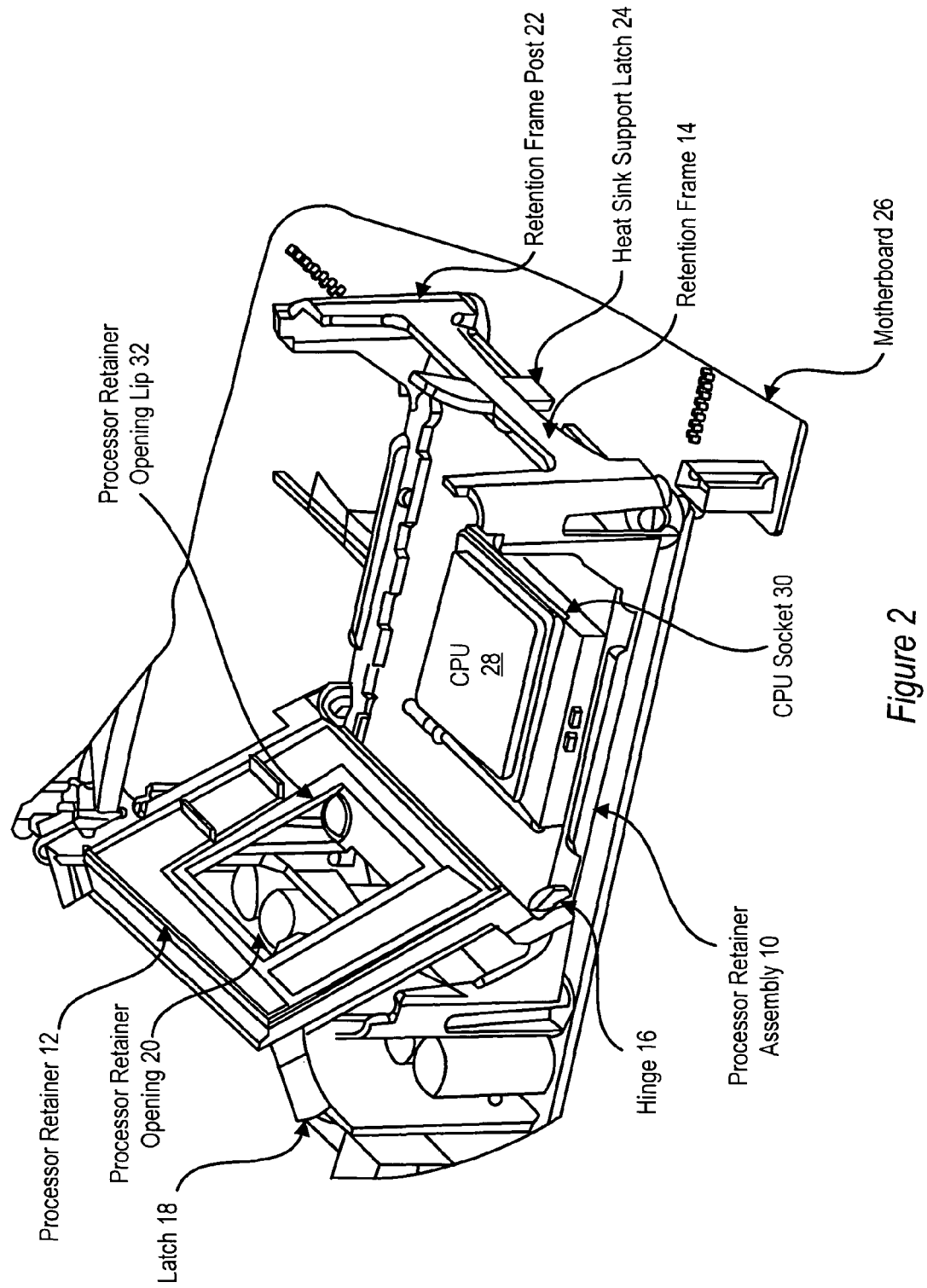
FIG. 2 depicts a side perspective view of a processor retainer assembly coupled to a motherboard in an open position.

Referring now to FIG. 2, a side perspective view depicts processor retainer assembly 10 installed on a motherboard 26 and configured in the open position to allow access to a CPU 28 installed in a CPU socket 30. For instance, CPU 28 has pins that insert in pin openings of CPU socket 30 or a Land Grid Array (LGA) interface. CPU socket 30 lies within the perimeter formed by retention frame 14 and is aligned so that rotation of processor retainer 12 about hinge 16 places CPU 28 within processor retainer opening 20. For instance, a lip 32 formed along the perimeter of processor retainer opening 20 is aligned to engage the outer perimeter of CPU 28 as processor retainer 12 rotates to a closed position.

Figure 3:
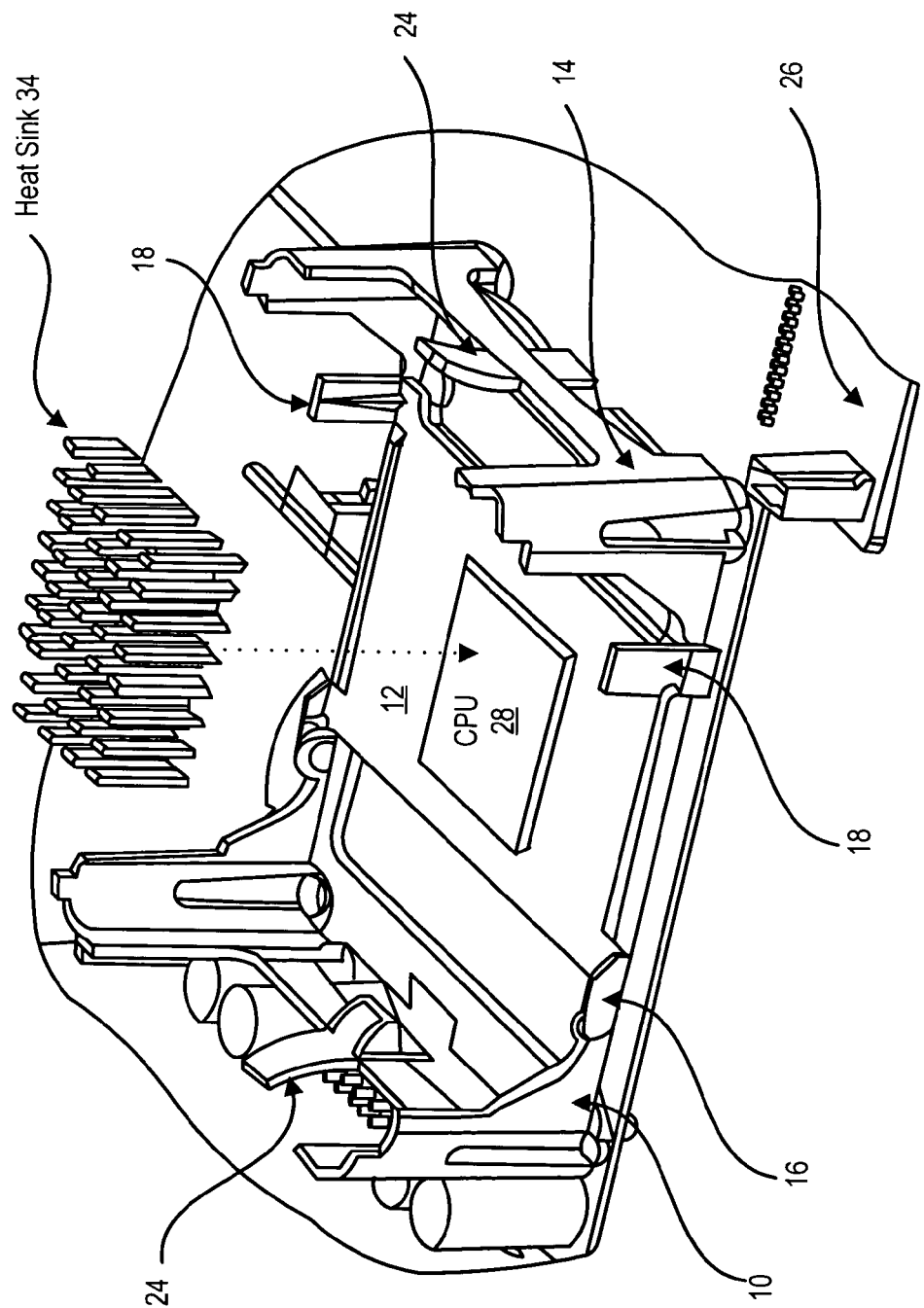
FIG. 3 depicts a side perspective view of a processor retainer assembly coupled to a motherboard in a closed position.

Referring now to FIG. 3, a side perspective view depicts processor retainer assembly 10 installed on motherboard 26 and configured in the closed position to retain CPU 28 in CPU socket 30. The lip along the inner diameter of processor retainer opening 20 engages the outer diameter edge of CPU 28 to restrict movement of CPU 28 from socket 30. Processor retainer 12 is maintained in a position substantially parallel with CPU 28 by the engagement of latches 18 with retention frame 14. Processor retainer 12 is released by flexing latches 18 and rotating upward about the hinge 16. A heat sink 34 inserts within retention frame 14 to contact CPU 28 and is retained by engagement of heat sink support latches 24. Heat sink 34 is removed by flexing support latches 24 to release the heat sink and then lifting the heat sink away from CPU 28. Separate retention of heat sink 34 by support latches 24 and processor 28 by processor retainer 12 reduces movement of processor 28 caused by coupling of processor 28 to heat sink 34 with thermal grease. External shocks and vibrations acting on an information handling system that cause movement of heat sink 34 are thus less likely to lift processor 28 from socket 30.

Figure 4:
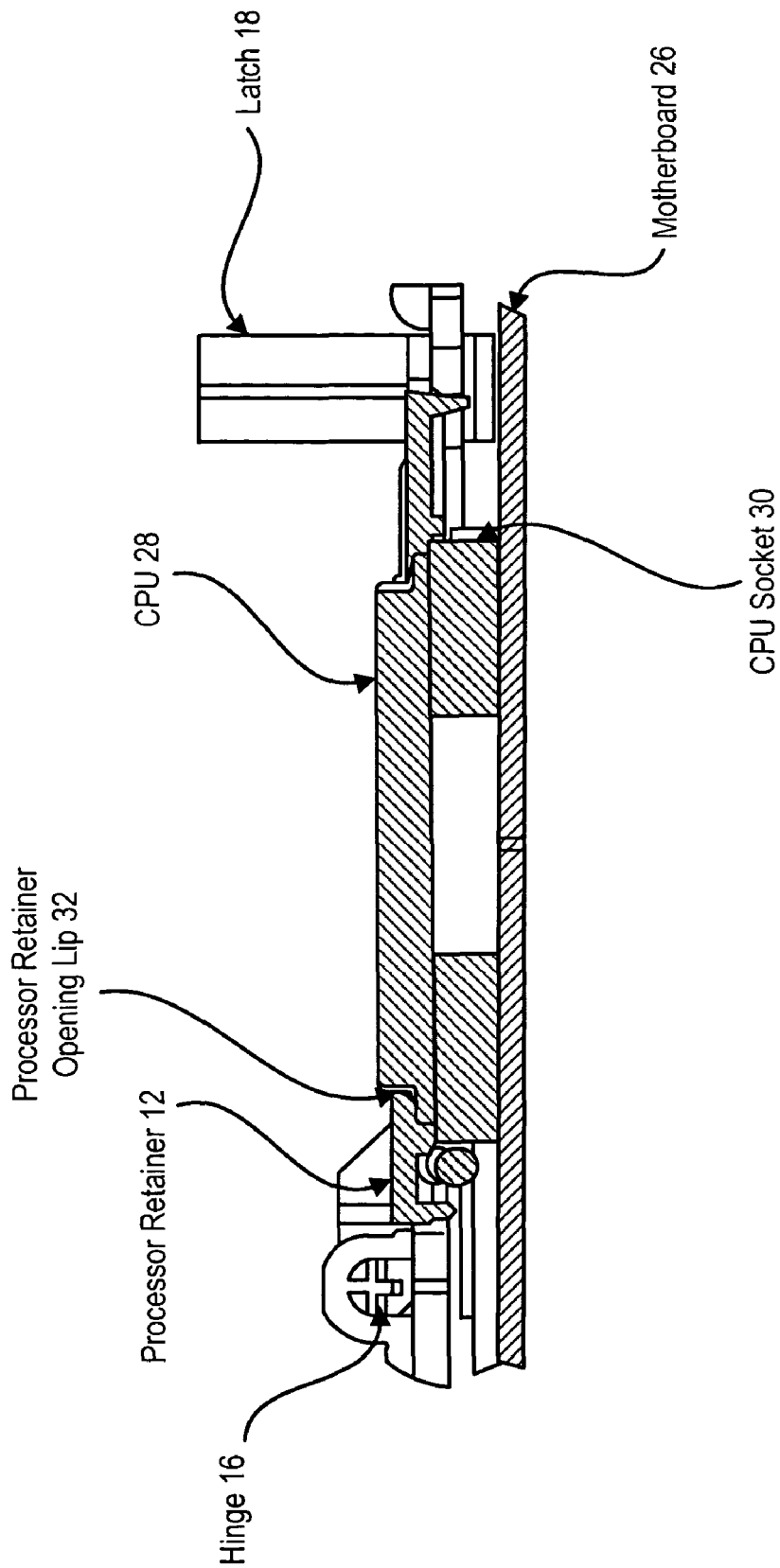
FIG. 4 depicts a side cutaway view of a CPU retained in a motherboard by engagement of the lip of a processor retainer with a CPU outer diameter edge.

Referring now to FIG. 4, a side cutaway view of processor retainer assembly 10 illustrates the engagement of processor retainer opening lip 32 along the outer diameter of CPU 28 so that the upper surface of CPU 28 is exposed for contact with heat sink 34. Contact of lip 32 with CPU 28 provides a retaining force that retains processor 28 in socket 30 even if upward force is applied to heat sink 34 and translated to CPU 28 by coupling of thermal grease between heat sink 34 and processor 28. In alternative embodiments, the shapes at the interfaces of processor retainer 12, CPU 28 and heat sink 34 may be altered to secure processor 28 in socket 30 and maintain contact between heat sink 34 and processor 28. For instance, portions of processor retainer 12 may overlap processor 28 with heat sink 34 formed to fit over the overlapping portions of processor retainer 12. Separate retention of processor 28 and heat sink 34 ensures that movement of heat sink 34 will not translate to processor 28 in an undesirable fashion.

Although the present invention has been described in detail, it should be understood that various changes, substitutions and alterations can be made hereto without departing from the spirit and scope of the invention as defined by the appended claims.

What is claimed is:

1. An information handling system comprising:
   plural components operable to support information processing;
   a motherboard having plural wires to communicate information between the components;
   a CPU socket disposed on the motherboard;
   a CPU coupled to the CPU socket;
   a retention frame coupled to the motherboard proximate the CPU;
   a processor retainer coupled to the retention frame and aligned over the CPU to releasably retain the CPU in the socket, the processor retainer having an opening aligned over the CPU; and
   a heat sink aligned with the processor retainer opening to conduct heat from the CPU.

2. The information handling system of claim 1 wherein the CPU has an upper surface, the upper surface having an outer diameter, and wherein the processor retainer opening has a diameter sized slightly smaller than the CPU upper surface diameter.

3. The information handling system of claim 1 further comprising a securing device rotationally coupling the processor retainer to the retention frame, the processor retainer operable to rotate between an open position with the CPU removable from the socket and a closed position with CPU held in the socket.

4. The information handling system of claim 1 further comprising a heat sink securing device coupled to the retention frame, the heat sink securing device releasably retaining the heat sink aligned with the processor retainer opening to conduct heat from the processor.

5. The information handling system of claim 2 further comprising a lip formed along the processor retainer opening diameter, the lip aligned to engage the CPU outer diameter.

6. The information handling system of claim 3 wherein the securing device comprises:
   a hinge rotationally coupling the processor retainer to the retention frame; and
   a latch coupled to the processor retainer and aligned to lock the processor retainer to the retention frame in the closed position.

7. The information handling system of claim 4 wherein the heat sink securing device comprises latches extending from the retention frame to engage the heat sink.

8. A method for retaining a processor engaged in a circuit board socket, the method comprising:
   coupling a retention frame to the circuit board proximate the socket;
   engaging a processor in the socket;
   coupling a processor retainer to the retention frame over the processor so that the processor retainer contacts the processor to retain the processor in the socket, and
   disposing a heat sink over the processor to contact the processor through an opening in the processor retainer, wherein coupling a processor retainer further comprises:
   hinging one edge of the processor retainer at an edge of the processor;
   rotating the processor retainer about the hinge to align the opposing edge of the processor retainer with the opposing edge of the processor; and
   engaging a latch proximate the opposing edge of the processor retainer with the retention frame to enclose the processor under the processor retainer.

9. The method of claim 8 further comprising:
   disposing thermal grease between the processor and the heat sink;
   translating a force exerted on the heat sink to the processor through coupling of the thermal grease; and
   resisting the translated force with the processor retainer to retain the processor in the socket.

10. The method of claim 8 wherein disposing a heat sink further comprises:
    aligning heat sink and retention frame connectors; and
    engaging the heat sink and retention frame connectors to secure the heat sink to the retention frame, the heat sink in contact with the processor through the processor retainer opening.

11. The method of claim 8 wherein engaging a processor in the socket further comprises:
    aligning processor pins with socket pin holes; and
    pressing the processor to engage the pins in the pin holes.

12. The method of claim 8 wherein the circuit board comprises a motherboard and the processor comprises a CPU.

13. A system for retaining a processor engaged in a socket, the socket disposed on a circuit board, the system comprising:
    a retention frame operable to couple to the circuit board proximate the socket;
    a processor retainer having a retaining surface formed to engage the processor with a retaining force that retains the processor in the socket and having a heat sink opening for contacting a heat sink with the processor; and
    heat sink supports extending from the retention frame and operable to engage a heat sink proximate to the processor retainer opening to remove heat from the processor; and
    a securing device movably coupling the processor retainer to the retention frame in an open position that allows access to the processor and a closed position that retains the processor in the socket, the securing device having one or more hinges rotationally coupling the processor retainer to the retention frame between the open and close positions and having one or more latches operable to couple the processor retainer to the retention frame in the closed position.

14. The system of claim 13 wherein the retaining surface comprises a lip formed along the processor retainer opening, the lip engaging the processor to assert a retaining force.

15. The system of claim 14 wherein the processor retainer opening is sized to guide the heat sink against the processor.

16. The system of claim 14 wherein circuit board comprises a motherboard and the processor comprises a CPU.

17. The system of claim 16 wherein the socket comprises a LGA socket.

* * * * *